(12) United States Patent
Chen et al.

(10) Patent No.: US 10,028,406 B2
(45) Date of Patent: Jul. 17, 2018

(54) SLIDE RAIL ASSEMBLY AND GUIDING MECHANISM THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 24 days.

(21) Appl. No.: 15/249,499

(22) Filed: Aug. 29, 2016

(65) Prior Publication Data
US 2017/0215298 A1 Jul. 27, 2017

(51) Int. Cl.
*H05K 7/18* (2006.01)
*A47B 88/04* (2006.01)
*H05K 7/14* (2006.01)

(52) U.S. Cl.
CPC ........... *H05K 7/183* (2013.01); *A47B 88/047* (2013.01); *A47B 88/0422* (2013.01); *H05K 7/1489* (2013.01); *A47B 2088/0429* (2013.01)

(58) Field of Classification Search
CPC .... H05K 7/183; H05K 7/1489; A47B 88/042; A47B 88/0418; A47B 88/0422; A47B 88/047; A47B 88/00; A47B 2088/0429; A47B 88/044; A47B 88/40; A47B 2088/4235; A47B 2088/423; A47B 47/00; A47F 7/00
USPC ... 248/298.1, 316.8, 220.21, 220.31, 220.41, 248/265.2, 265.3, 201; 312/334.7, 333, 312/334.8, 334.44, 334.46, 330.1, 223.1,
(Continued)

(56) References Cited

U.S. PATENT DOCUMENTS 5,833,337 A * 11/1998 Kofstad ............... H05K 7/1421
211/175
6,220,456 B1 * 4/2001 Jensen ...................... G06F 1/16
211/189
(Continued)

FOREIGN PATENT DOCUMENTS

GB 2 432 626 A 5/2007
JP H1117094 A 5/1989
(Continued)

*Primary Examiner* — Nkeisha Smith
(74) *Attorney, Agent, or Firm* — Winston Hsu

(57) ABSTRACT

A slide rail assembly is configured to mount a chassis to a rack. A plurality of mounting members are arranged at one side of the chassis. The slide rail assembly includes a first rail, a second rail and a guiding base. The second rail includes a side wall and a bottom wall. The guiding base is disposed at a front end of the second rail. The guiding base defines an entry, an exit and a passage located between the entry and the exit. The second rail is moved out of the rack relative to the first rail. The bottom wall of the second rail abuts against a bottom part of the chassis for pushing the chassis into the rack. The chassis is mounted to the second rail through guiding the plurality of mounting members by the entry to pass through the passage and the exit.

13 Claims, 10 Drawing Sheets

(58) Field of Classification Search
USPC ......... 312/265.1, 265.4, 319.1, 334.1, 334.4, 312/334.5
See application file for complete search history.

(56) References Cited

U.S. PATENT DOCUMENTS

| | | | | |
|---|---|---|---|---|
| 6,681,942 | B2 * | 1/2004 | Haney | H05K 7/1421 |
| | | | | 211/183 |
| 6,945,619 | B1 * | 9/2005 | Chen | A47B 88/487 |
| | | | | 312/334.44 |
| 7,108,340 | B2 * | 9/2006 | Lai | A47B 88/57 |
| | | | | 312/333 |
| 7,192,103 | B2 * | 3/2007 | Hamilton | A47B 88/43 |
| | | | | 211/175 |
| 7,703,734 | B2 * | 4/2010 | Chen | A47B 88/43 |
| | | | | 108/108 |
| 7,744,178 | B2 * | 6/2010 | Bridges | G11B 33/12 |
| | | | | 312/334.47 |
| 7,871,139 | B2 * | 1/2011 | Yu | A47B 88/43 |
| | | | | 312/333 |
| 7,911,777 | B2 * | 3/2011 | Fan | G06F 1/187 |
| | | | | 312/223.1 |
| 8,231,188 | B1 * | 7/2012 | Chen | A47B 88/57 |
| | | | | 312/333 |
| 8,317,037 | B2 * | 11/2012 | Henderson | H05K 7/1489 |
| | | | | 211/26 |
| 8,320,118 | B2 * | 11/2012 | Chuang | G11B 33/124 |
| | | | | 211/26 |
| 8,939,525 | B1 * | 1/2015 | Chen | A47B 88/047 |
| | | | | 312/333 |
| 9,161,625 | B2 * | 10/2015 | Chen | A47B 88/044 |
| 9,557,782 | B2 * | 1/2017 | Hsu | G06F 1/182 |
| 9,693,627 | B2 * | 7/2017 | Chen | A47B 88/407 |
| 9,750,155 | B2 * | 8/2017 | Henderson | G06F 1/181 |
| 2001/0040142 | A1 | 11/2001 | Haney | |
| 2002/0084734 | A1 | 7/2002 | Shih | |
| 2003/0141791 | A1 * | 7/2003 | Dubon | H05K 7/1421 |
| | | | | 312/333 |
| 2005/0088069 | A1 * | 4/2005 | Greenwald | A47B 88/49 |
| | | | | 312/333 |
| 2005/0231083 | A1 * | 10/2005 | Garcie, Jr. | A47B 88/467 |
| | | | | 312/333 |
| 2007/0018547 | A1 * | 1/2007 | Yang | H05K 7/1489 |
| | | | | 312/333 |
| 2007/0114895 | A1 * | 5/2007 | Chen | H05K 7/1489 |
| | | | | 312/333 |
| 2008/0284299 | A1 | 11/2008 | Chen | |
| 2009/0294393 | A1 | 12/2009 | Chen | |
| 2012/0120578 | A1 | 5/2012 | Henderson | |
| 2012/0161599 | A1 | 6/2012 | Chen | |
| 2014/0145577 | A1 * | 5/2014 | Zimmermann | E05B 65/44 |
| | | | | 312/327 |
| 2015/0129526 | A1 * | 5/2015 | Chen | A47B 88/044 |
| | | | | 211/134 |
| 2015/0181753 | A1 * | 6/2015 | Murakami | H05K 7/1489 |
| | | | | 211/26 |
| 2016/0345730 | A1 * | 12/2016 | Lim | A47B 96/07 |
| 2017/0013959 | A1 * | 1/2017 | Chen | A47B 96/07 |
| 2017/0135472 | A1 * | 5/2017 | Chen | A47B 88/0014 |

FOREIGN PATENT DOCUMENTS

| | | |
|---|---|---|
| JP | 3137046 U | 11/2007 |
| JP | 3153485 U | 9/2009 |

* cited by examiner

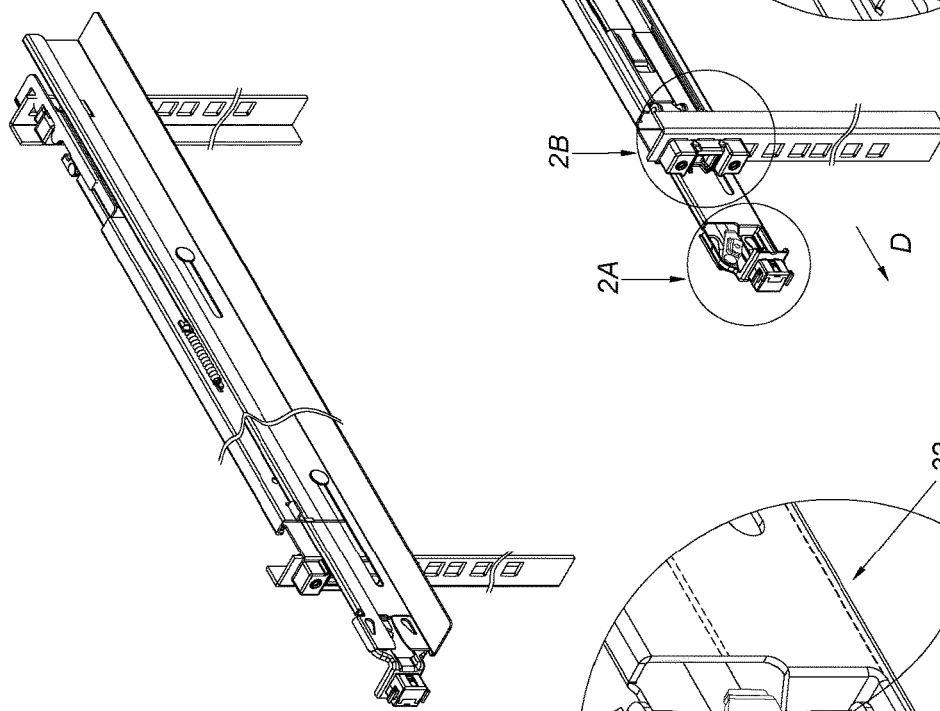
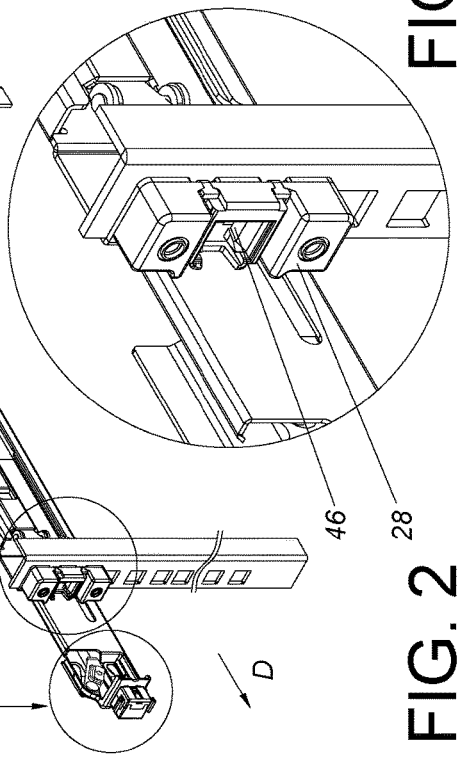
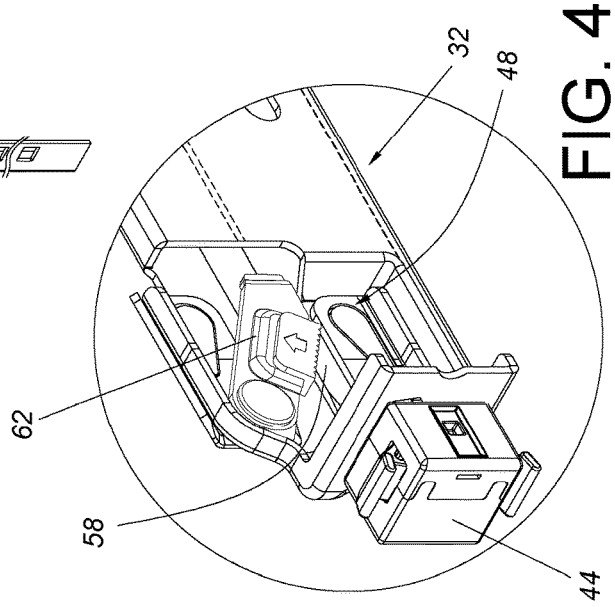
FIG. 2   FIG. 5
FIG. 4

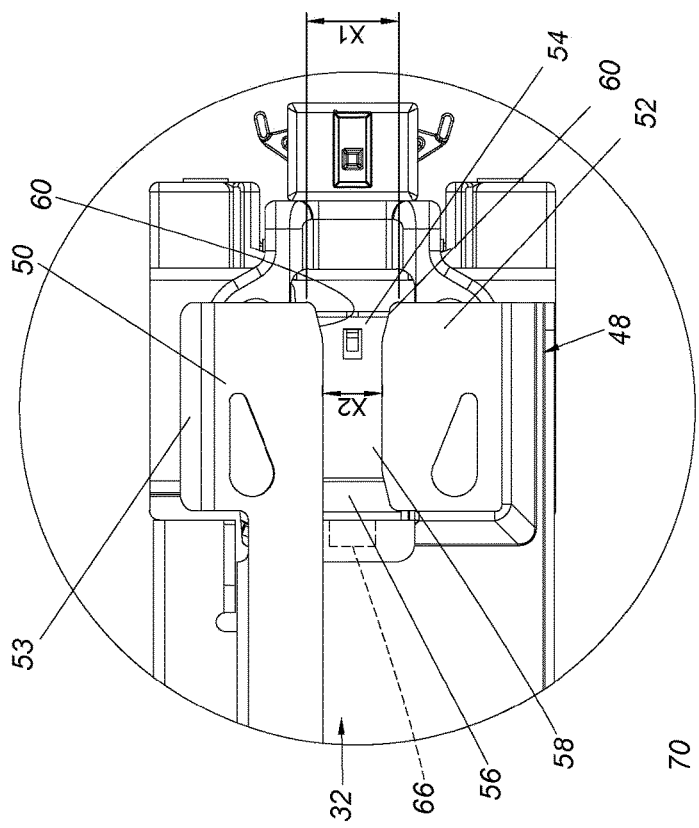
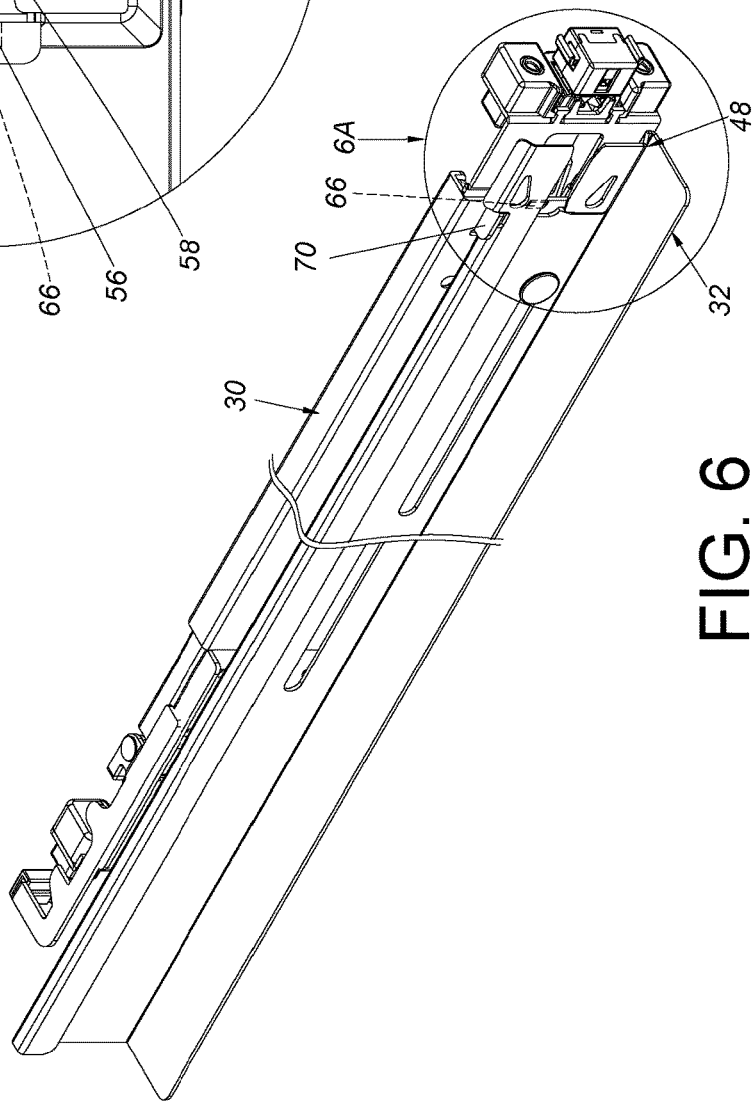
FIG. 7
FIG. 6

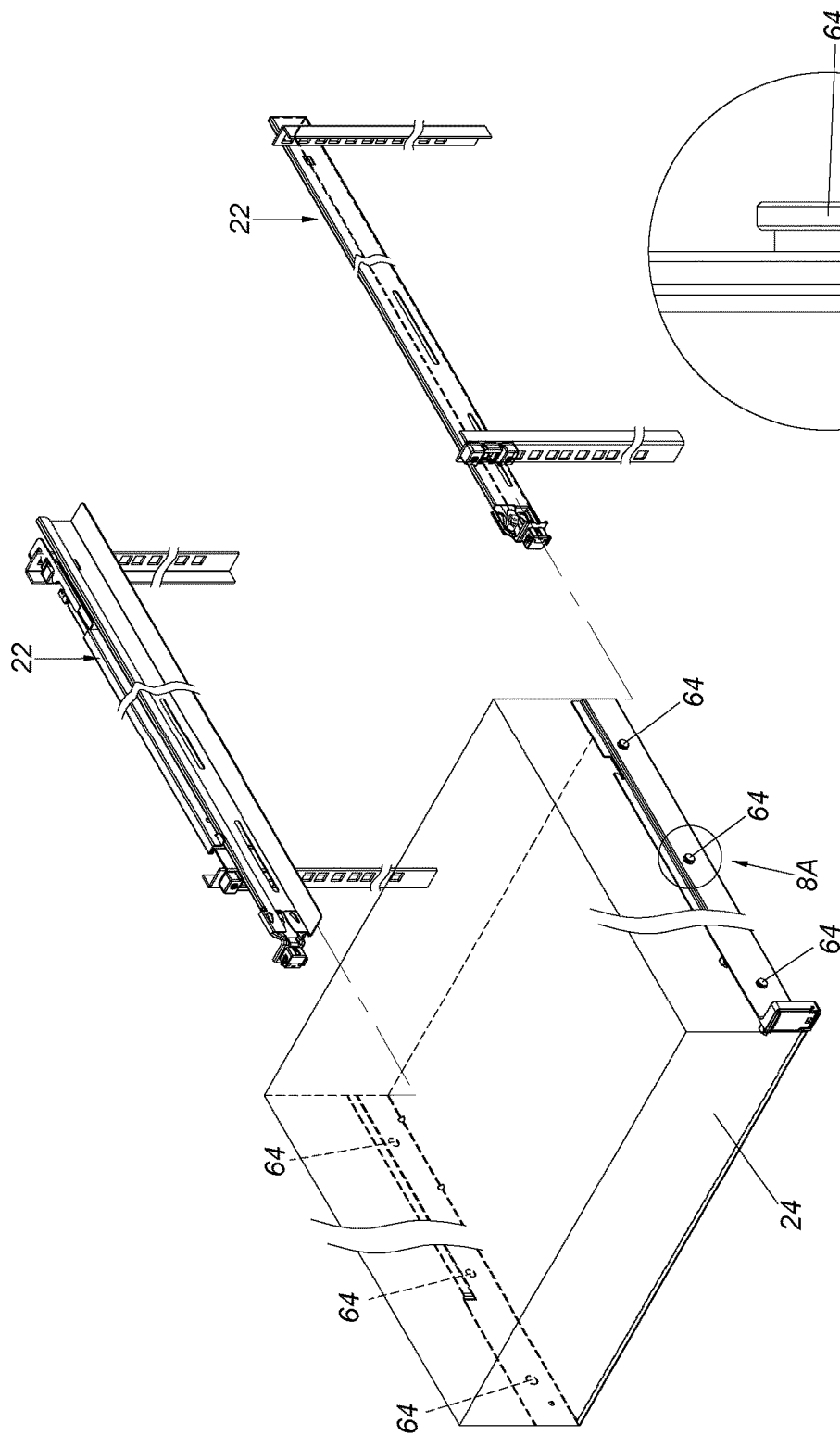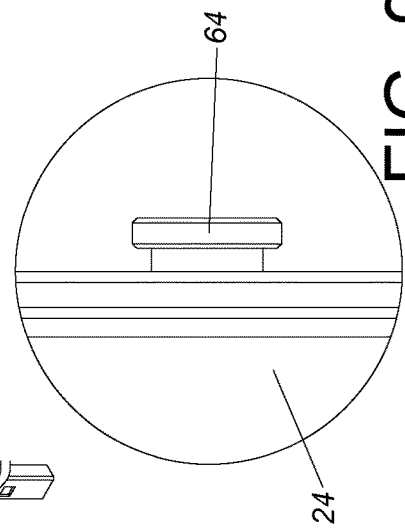

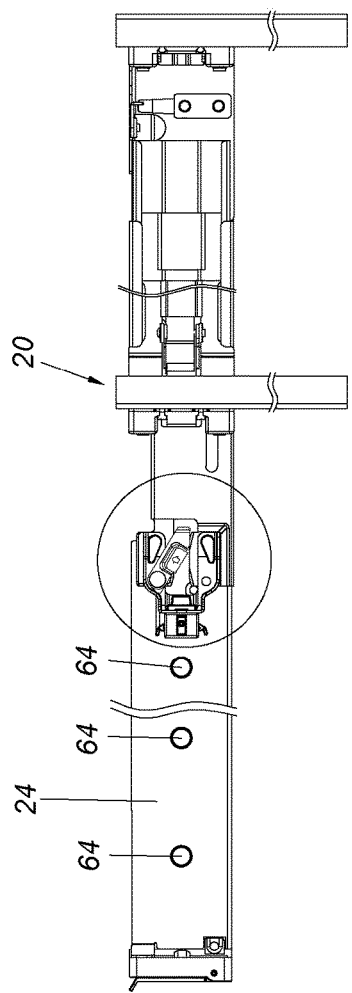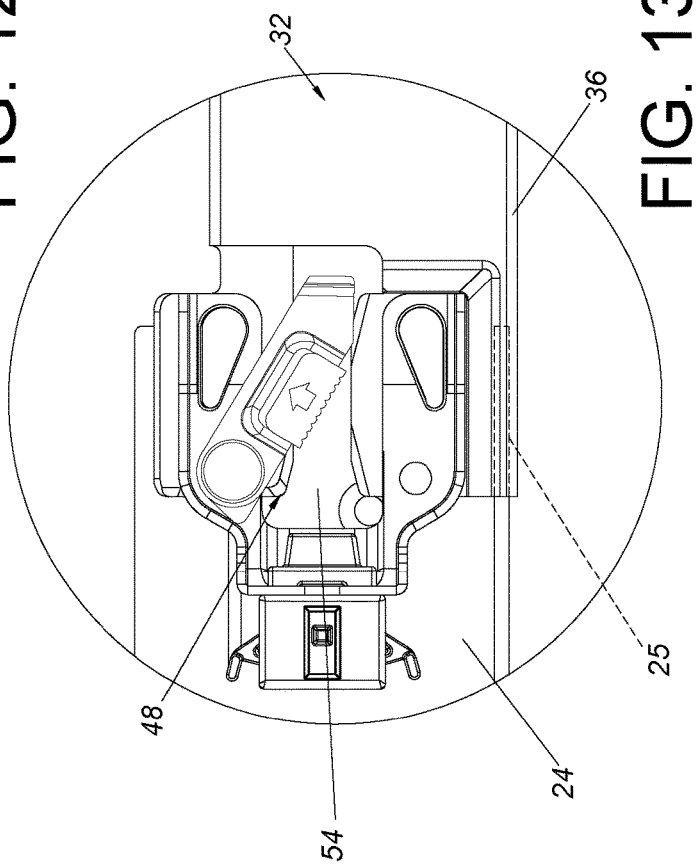

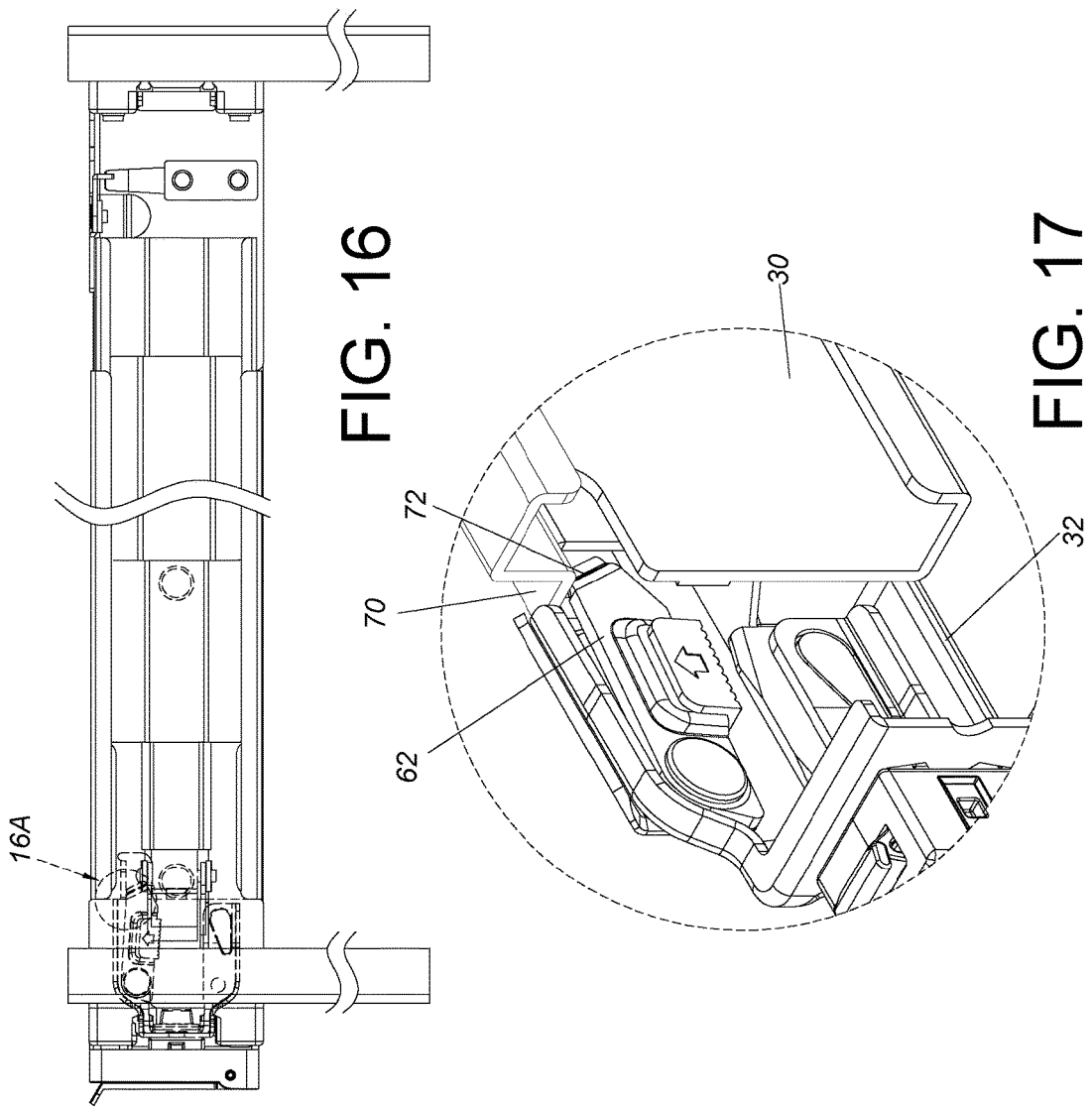

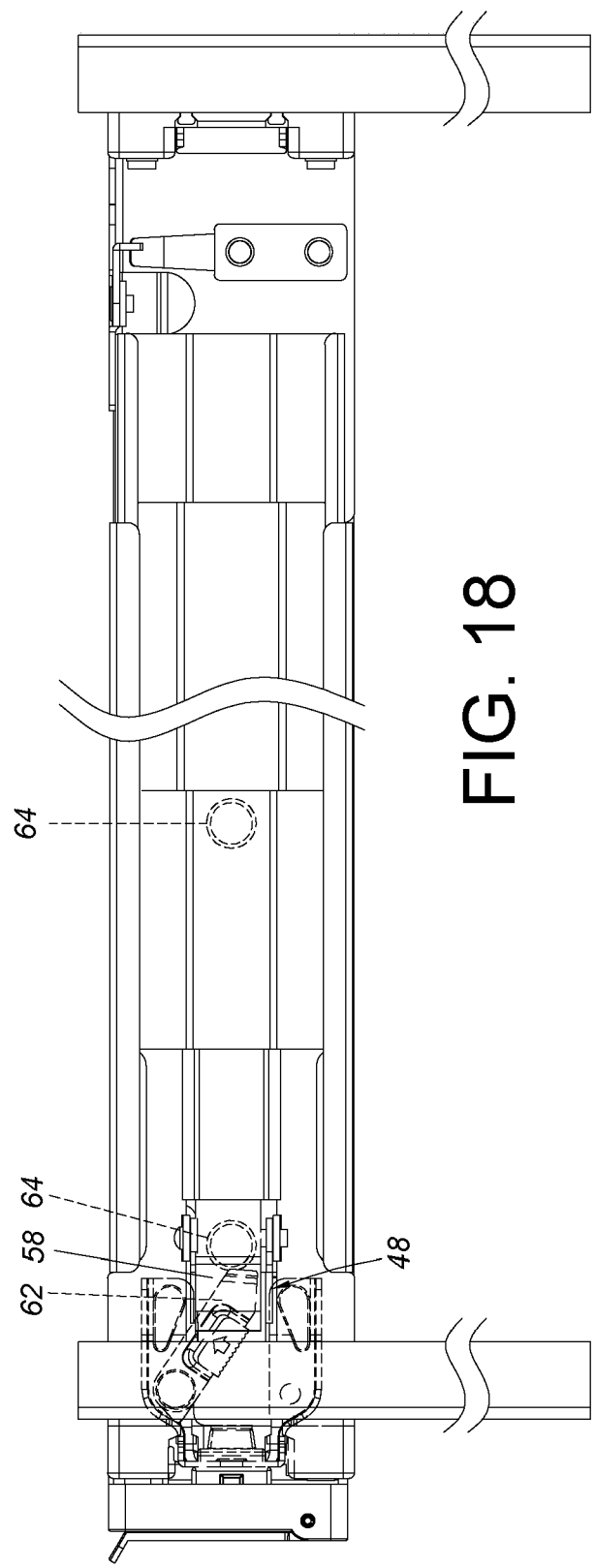

SLIDE RAIL ASSEMBLY AND GUIDING MECHANISM THEREOF

BACKGROUND OF THE INVENTION

1. Field of the Invention

The present invention relates to a slide rail assembly, and more particularly, to a slide rail assembly capable of guiding a chassis to be quickly mounted to a rack for providing stable support to the chassis.

2. Description of the Prior Art

U.S. Pat. No. 6,220,456 B1 of Jensen et al. discloses a method and an apparatus for supporting a computer chassis. The case discloses a rack-mounted computer system comprising at least two posts (16). A rail (20) is attached to each post. Each of the rails comprises two ribs (24) that together define a slot. One portion of the slot has a greater separation between the two ribs. A computer component chassis (12) comprises two faces (100, 102) on its outer surface. Each of the faces has at least one protuberance (104). The protuberances are shaped to fit at least partially into the slot (26) of one of the rails at the portion having the larger separation. The case only teaches that the two rids of the rail are utilized to support the chassis. Although the chassis can be rapidly mounted to the rail, supporting capability of the rail is limited due to design of supporting structure.

U.S. Pat. No. 8,317,037 B2 of Henderson et al. discloses a rail including a shelf for supporting an information handling system. The rail comprises an upper support structure and a lower support structure, a slot defined by the upper and lower support structures, and a shelf extending from the lower support structure to exceed a front end of the upper support structure. Through the above design, a chassis can be rapidly mounted to the rail to be supported by the rail.

However, in the above two cases, the disclosed rail has a portion fixedly arranged at an outer side of the rack. Therefore, the rail is not applicable to a cabinet type rack. For different product requirements, slide rail assemblies with different assembly methods can be provided to bring more options to the market.

SUMMARY OF THE INVENTION

The present invention relates to a slide rail assembly and a guiding mechanism thereof.

According to an embodiment of the present invention, a slide rail assemble comprises a first rail, a second rail and a guiding base. The second rail is movable relative to the first rail along a longitudinal direction. The second rail comprises a side wall and a bottom wall perpendicularly connected to the side wall. Wherein, a first transverse width is defined between the side wall and an edge of the bottom wall. The guiding base is arranged at a front end of the second rail. The guiding base comprises a first guiding section and a second guiding section. The first guiding section and the second guiding section define an entry, an exit and a passage located between the entry and the exit. Wherein, the entry, the exit and the passage are arranged along a same direction. Wherein, a second transverse width is defined between the entry of the guiding base and the edge of the bottom wall of the second rail, and the second transverse width is smaller than the first transverse width.

Preferably, a plurality of elongated holes are formed on the side wall of the second rail. The second rail is connected to the first rail by a plurality of connecting members with each of the connecting members passing through the corresponding elongated hole, such that the second rail is movable relative to the first rail within a limited space defined by the elongated holes.

Preferably, the slide rail assembly further comprises an elastic member configured to provide an elastic force to the second rail for driving the second rail to move relative to the first rail.

Preferably, one of the first guiding section and the second guiding section of the guiding base has an inclined guiding surface located at the entry, such that a width of the entry is greater than a width of the passage.

According to another embodiment of the present invention, a slide rail assembly is configured to mount a chassis to a rack. A plurality of mounting members are arranged at one side of the chassis. The slide rail assembly is mounted to the rack through a pair of brackets. The slide rail assembly comprises a first rail; a second rail movable relative to the first rail along a longitudinal direction, the second rail comprising a side wall and a bottom wall perpendicularly connected to the side wall; and a guiding base arranged at a front end of the second rail, the guiding base comprising a first guiding section and a second guiding section, the first guiding section and the second guiding section defining an entry, an exit and a passage located between the entry and the exit; wherein during mounting the chassis to the rack, the second rail is moved out of the rack relative to the first rail, in order to allow the bottom wall of the second rail to abut against a bottom part of the chassis for further pushing the chassis into the rack, the chassis is mounted to the second rail through guiding the plurality of mounting members by the entry of the guiding base to pass through the passage and the exit of the guiding base.

Preferably, a front end of the first rail has a protrusion facing the side wall of the second rail, such that when the second rail is moved out of the rack relative to the first rail, the second rail is deflected by the protrusion of the first rail.

Preferably, the slide rail assembly further comprises a blocking member movably mounted on the second rail. A portion of the blocking member is located in the passage of the guiding base.

Preferably, the slide rail assembly further comprises an engagement member arranged on the second rail. One of the pair of brackets has a mounting base. The engagement member is engaged with the mounting base when the second rail is retracted relative to the first rail.

Preferably, the slide rail assembly further comprises an elastic member configured to provide an elastic force to the second rail. When the engagement member is disengaged from the mounting base, the second rail is driven to move relative to the first rail by the elastic force of the elastic member.

Preferably, the blocking member is configured to be operatively moved away from the passage of the guiding base, in order to allow the chassis to be detached from the second rail.

Preferably, the blocking member has an abutting feature. The blocking member is configured to be operatively moved away from the passage of the guiding base for being held at an abutting position outside the passage of the guiding base by the abutting feature.

Preferably, the first rail has a releasing feature corresponding to the blocking member at the abutting position, and one of the releasing feature and the blocking member has an inclined surface configured to push the blocking member away from the abutting position when the second rail is retracted relative to the first rail.

Preferably, a first transverse width is defined between the side wall and an edge of the bottom wall of the second rail. A second transverse width is defined between the entry of the guiding base and the edge of the bottom wall of the second rail. A third transverse width is defined between the mounting member of the chassis and the edge of the bottom wall of the second rail. The third transverse width is between the first transverse width and the second transverse width.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a diagram showing the slide rail assemblies being moved out of the rack according to an embodiment of the present invention.

FIG. 3 is an enlarged view of an area 1A in FIG. 1.

FIG. 4 is an enlarged view of an area 2A in FIG. 2.

FIG. 5 is an enlarged view of an area 2B in FIG. 2.

FIG. 6 is a diagram showing the slide rail assembly according to an embodiment of the present invention.

FIG. 7 is an enlarged view of an area 6A in FIG. 6.

FIG. 8 is a diagram showing arrangement between a chassis and the slide rail assemblies according to an embodiment of the present invention.

FIG. 9 is an enlarged view of an area 8A in FIG. 8.

FIG. 12 is a diagram showing the chassis being mounted to the slide rail assembly according to an embodiment of the present invention.

FIG. 13 is a diagram showing a mounting member of the chassis before being guided by a guiding base of the slide rail assembly.

FIG. 16 is a diagram showing the chassis being mounted to the slide rail assembly while the blocking member is still located outside the passage.

FIG. 17 is an enlarged view of an area 16A in FIG. 16.

FIG. 18 is a diagram showing the chassis being mounted to the slide rail assembly while the blocking member is moved back to the passage for blocking the mounting member of the chassis.

DETAILED DESCRIPTION

Figure 1:
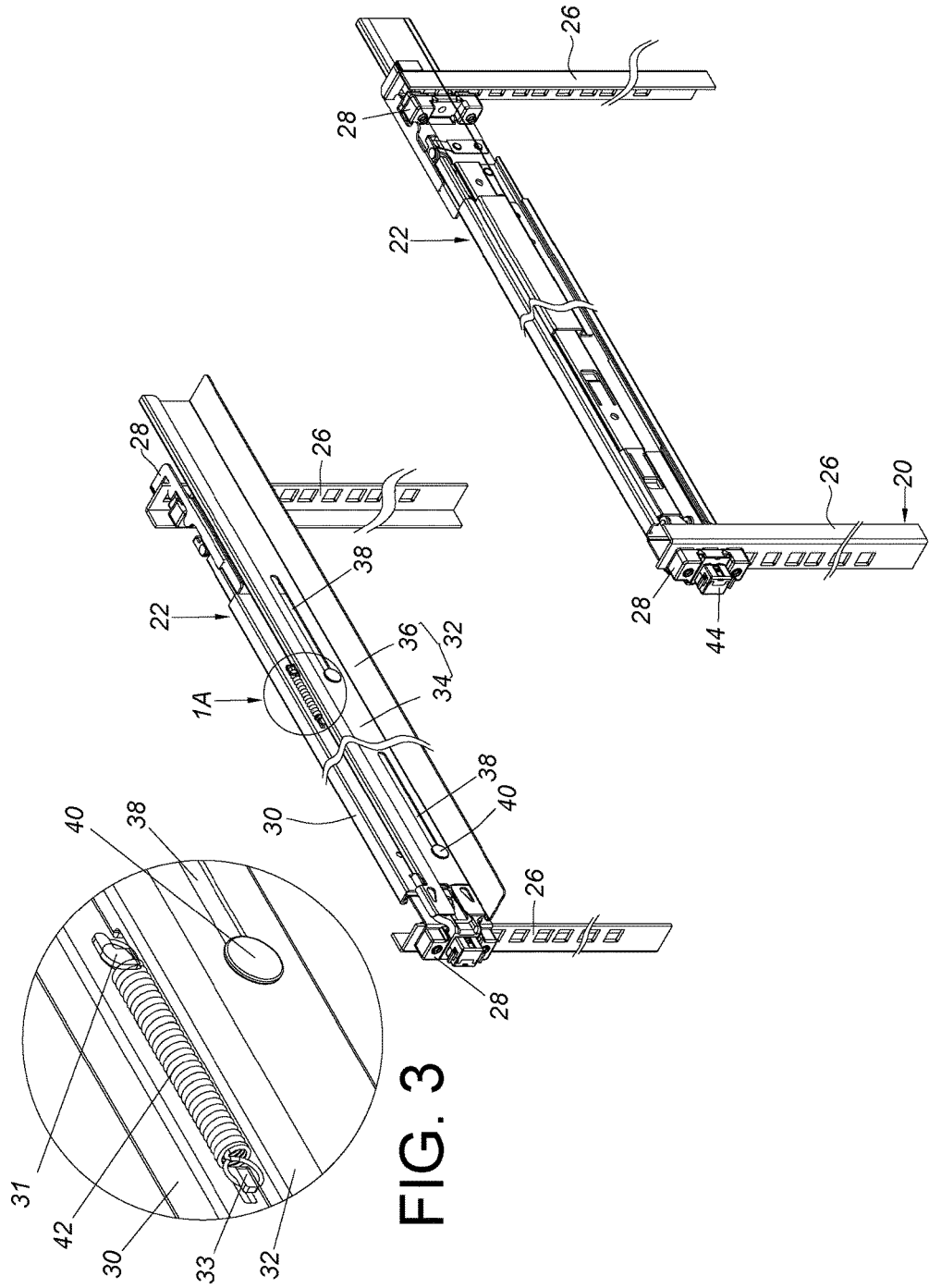
FIG. 1 is a diagram showing a pair of slide rail assemblies being mounted to a rack according to an embodiment of the present invention.

FIG. 1 and FIG. 2 are diagrams showing a rack 20 and a pair of slide rail assemblies 22 according to an embodiment of the present invention. The rack 20 comprises a plurality of posts 26. Each of the slide rail assemblies 22 is mounted to two of the posts 26 of the rack 20 by a pair of brackets 28. The slide rail assembly 22 comprises a first rail 30 and a second rail 32. Wherein, the first rail 30 is mounted to the pair of brackets 28 as a reinforcement cover. The second rail 32 is movable relative to the first rail 30 along a longitudinal direction D. The second rail 32 comprises a side wall 34 and a bottom wall 36 perpendicularly connected to the side wall 34.

Preferably, a plurality of elongated holes 38 are formed on the side wall 34 of the second rail 32. The second rail 32 is connected to the first rail 30 by a plurality of connecting members 40 with each of the connecting members passing through the corresponding elongated hole 38, such that the second rail 32 is movable relative to the first rail 30 within a limited space defined by the elongated holes 38.

As shown in FIG. 3, the present invention further comprises an elastic member 42 configured to provide an elastic force to the second rail 32 for driving the second rail 32 to move relative to the first rail 30. Specifically, the first rail 30 has a first mounting feature 31, and the second rail 32 has a second mounting feature 33. Two ends of the elastic member 42 are respectively connected to the first mounting feature 31 of the first rail 30 and the second mounting feature 33 of the second rail 32.

As shown in FIG. 4, the present invention further comprises an engagement member 44 arranged on the second rail 32. As shown in FIG. 5, one of the brackets has a mounting base 46. When the second rail 32 is retracted relative to the first rail 30, the engagement member 44 is engaged with the mounting base 46 (refer to FIG. 1). In addition, when the second rail 32 is retracted relative to the first rail 30 to be fixed in the rack 20, the elastic member 42 generates an elastic force. When the engagement member 44 is disengaged from the mounting base 46, the second rail 32 is driven to move out of the rack 20 relative to the first rail 30 (refer to FIG. 2) by the elastic force of the elastic member 42, for mounting a chassis 24 (refer to FIG. 8).

As shown in FIG. 6 and FIG. 7, the present invention further comprises a guiding base 48 arranged at a front end of the second rail 32. Preferably, the guiding base 48 and the second rail 32 are formed in one piece. The guiding base 48 comprises a first guiding section 50 and a second guiding section 52. The first guiding section 50 and the second guiding section 52 define an entry 54, an exit 56 and a passage 58 located between the entry 54 and the exit 56, wherein the entry 54, the exit 56 and the passage 58 are arranged along a same direction. In addition, one of the first guiding section 50 and the second guiding section 52 of the guiding base 48 has an inclined guiding surface 60 located at the entry 54, such that a width X1 of the entry 54 is greater than a width X2 of the passage 58. Preferably, the guiding base 48 further comprises a third guiding section 53 located above the first guiding section 50. For example, the third guiding section 53 is extended from an upper portion of the first guiding section 50 and bent outwardly, such that the chassis 24 above the third guiding section 53 can be guided by the third guiding section 53 to be dropped on the front end of the second rail 32.

Please refer to FIG. 4. Preferably, the present invention further comprises a blocking member 62 movably mounted on the second rail 32. A portion of the blocking member 62 is located in the passage 58 of the guiding base 48.

FIG. 8 and FIG. 9 are diagrams showing installation arrangement between the chassis 24 and the pair of slide rail assemblies 22. Wherein, a plurality of mounting members 64 are arranged at two sides of the chassis 24.

Figure 10:
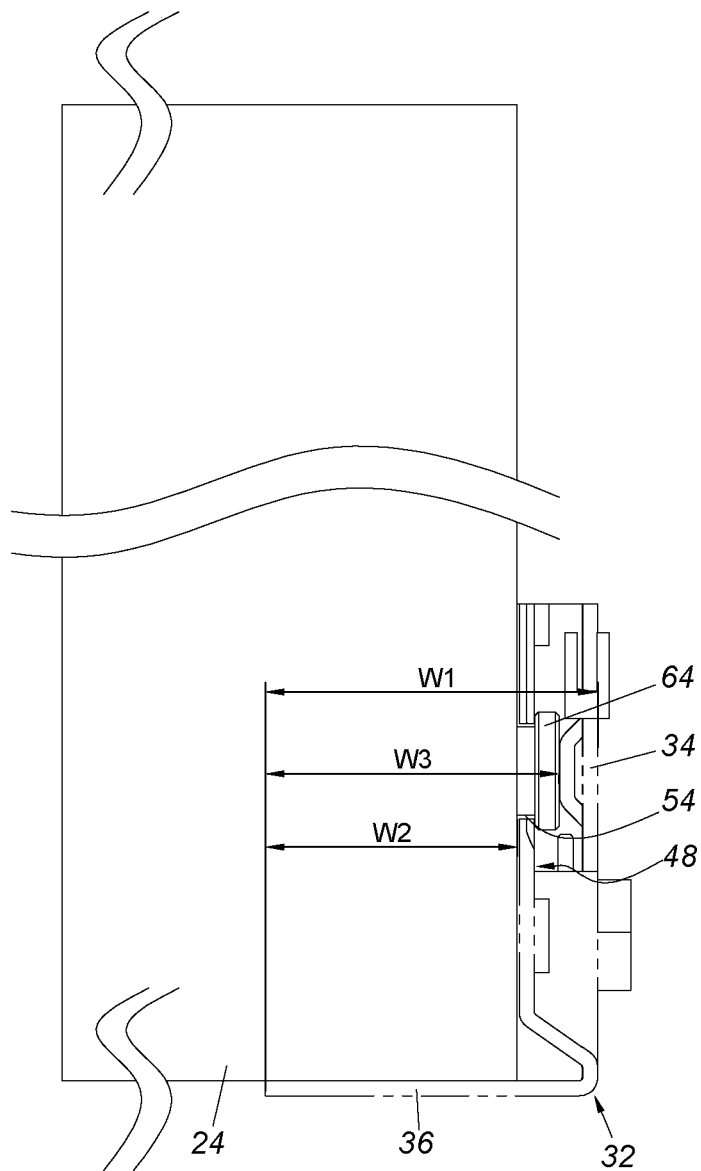
FIG. 10 is a diagram showing the chassis being mounted to the slide rail assembly according to an embodiment of the present invention.

As shown in FIG. 10, a first transverse width W1 is defined between the side wall 34 and an edge of the bottom wall 36 of the second rail 32. A second transverse width W2 is defined between the entry 54 of the guiding base 48 and the edge of the bottom wall 36 of the second rail 32. A third transverse width W3 is defined between the mounting member 64 of the chassis 24 and the edge of the bottom wall 36 of the second rail 32. The third transverse width W3 is between the first transverse width W1 and the second transverse width W2. In addition, the second transverse width W2 is smaller than the first transverse width W1.

Figure 11:
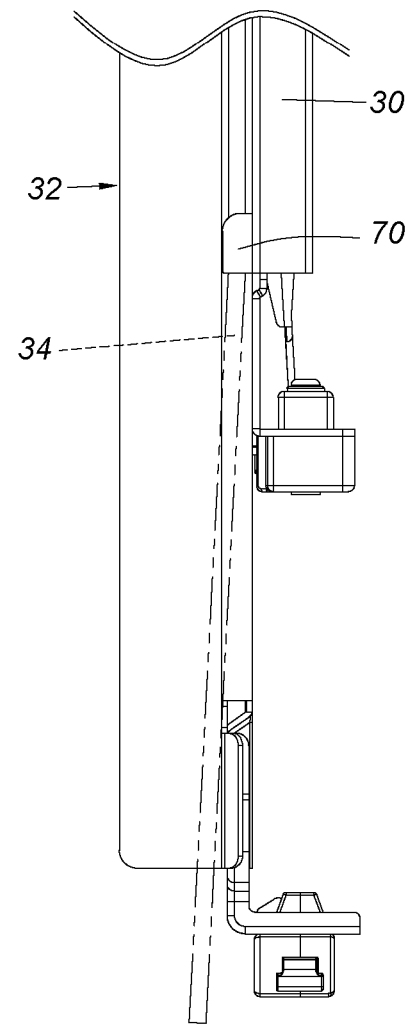
FIG. 11 is a diagram showing the slide rail assembly being deflected by a protrusion when the slide rail assembly is moved according to an embodiment of the present invention.
Figure 14:
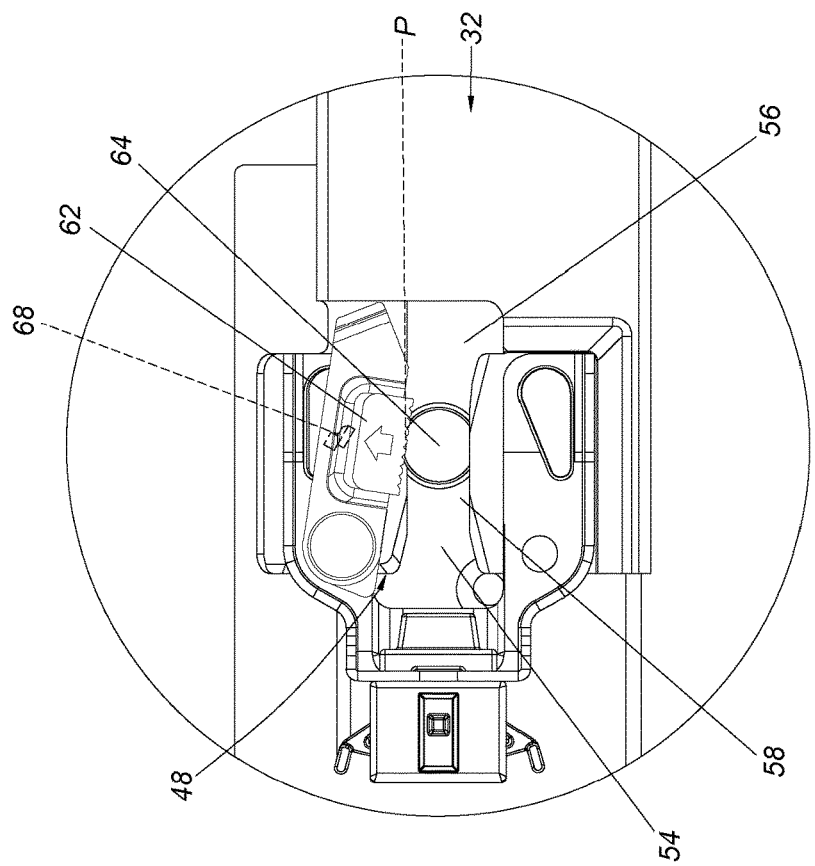
FIG. 14 is a diagram showing the mounting member of the chassis being guided by the guiding base of the slide rail assembly.

As shown in FIG. 6, preferably, a front end of the first rail 30 has a protrusion 66 facing the side wall 34 of the second rail 32. As shown in FIG. 10 and FIG. 11, when the second rail 32 is moved out of the rack 20 relative to the first rail 30, the second rail 32 is deflected by the protrusion 66 of the first rail 30, so as to allow the second rail 32 to be closer to the chassis 24, in order to facilitate guiding the plurality of mounting members 64 of the chassis 24 into the guiding base 48.

According to the above arrangement, when the chassis 24 is going to be mounted to the rack 20, the engagement member 44 is disengaged from the mounting base 46, such that the second rail 32 is driven to move out of the rack 20 relative to the first rail 30 by the elastic member 42 (refer to FIG. 1 to FIG. 5).

As shown in FIG. 12 to FIG. 15, a user can place the chassis 24 to allow a portion of a bottom part 25 of the chassis 24 to abut against the bottom wall 36 of the second rail 32, and then push the chassis 24 toward the rack 20. In such process, the plurality of mounting members 64 of the chassis 24 are guided by the entry 54 of the guiding base 48 to pass through the passage 58 and the exit 56 of the guiding base 48, such that the chassis 24 can be mounted into the rack 20 and firmly supported by the second rail 32. Even when the chassis 24 is slightly unaligned to the front end of the second rail 32 during mounting, the entry 54 of the guiding base 48 can correctly guide the mounting members 64 of the chassis 24. In other words, the chassis 24 can be rapidly and correctly mounted to the second rail 32 through guiding the mounting members 64 by the inclined guiding surface 60 (refer to FIG. 7).

Figure 15:
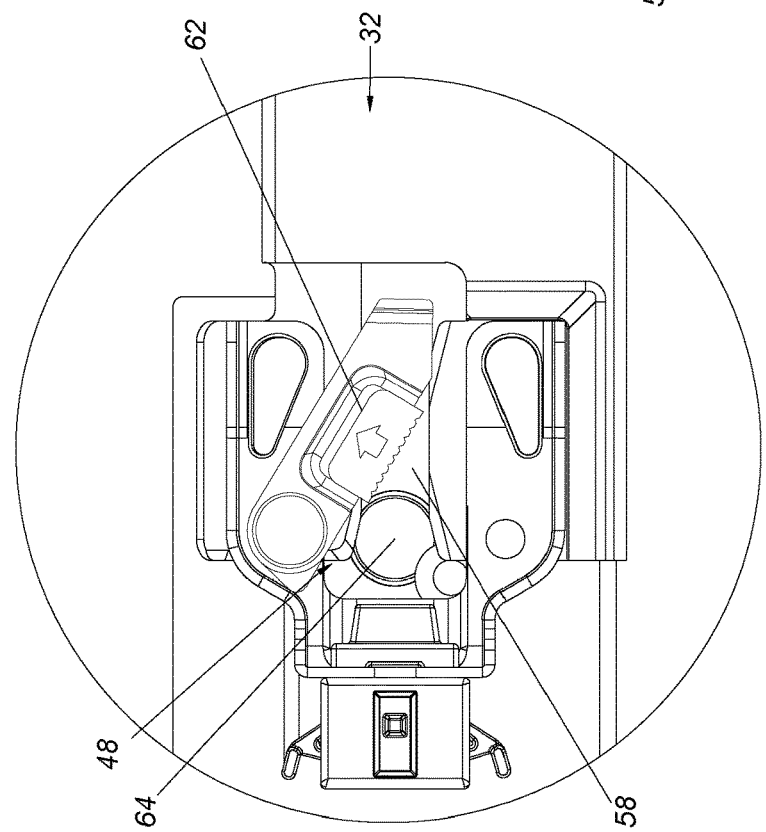
FIG. 15 is a diagram showing a blocking member being pushed by the mounting member of the chassis to be temporarily located outside the passage according to an embodiment of the present invention.

More particularly, when the plurality of mounting members 64 of the chassis 24 pass through the passage 58 of the guiding base 48, the blocking member 62 is pushed. Preferably, as shown in FIG. 15, the blocking member 62 of the present invention has an abutting feature 68. The blocking member 62 can be operatively moved away from the passage 58 of the guiding base 48 for being held at an abutting position P outside the passage 58 of the guiding base 48 by the abutting feature 68. After the last mounting member of the plurality of mounting members 64 of the chassis 24 passes through the exit 56 of the guiding base 48, the blocking member 62 can be manually moved away from the abutting position P.

In another embodiment, the blocking member 62 can also be designed to be automatically detached from the abutting position P. Please refer to FIG. 6 and FIG. 15. The first rail 30 can be arranged with a releasing feature 70 corresponding to the blocking member 62 located at the abutting position P. As shown in FIG. 16 to FIG. 18, one of the releasing feature 70 and the blocking member 62 has an inclined surface 72 configured to push the blocking member 62 away from the abutting position P back to an initial position when the second rail 32 is retracted relative to the first rail 30.

In other words, after the blocking member 62 is pushed away from the abutting position P, the blocking member 62 freely swings back to the passage 58 of the guiding base 48 in order to block the last mounting member 64 of the chassis 24.

On the other hand, when the chassis 24 is going to be detached from the rack 20, the blocking member 62 can be operatively moved away from the passage 58 of the guiding base 48, for allowing the chassis 24 to be detached from the second rail 32. As such, the chassis 24 can be further detached from the rack 20 conveniently.

Figure 19:
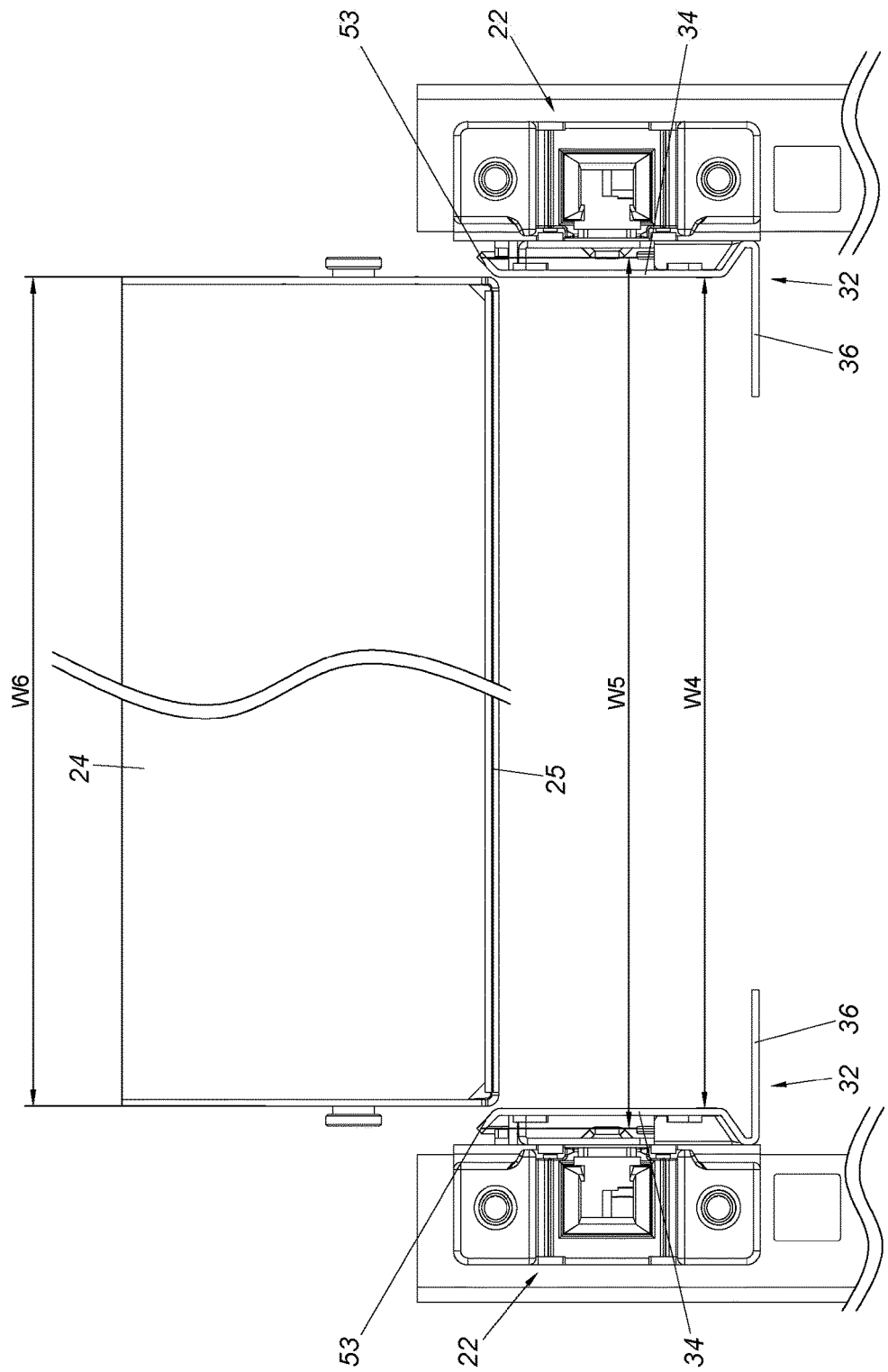
FIG. 19 is a diagram showing the chassis to be mounted to the slide rail assembly in a top-down manner.

As shown in FIG. 19, a fourth transverse width W4 is defined between the side walls 34 of the second rails 32 of the pair of slide rail assemblies 22, and a fifth transverse width W5 is defined between the third guiding sections 53 of the second rails 32 of the pair of slide rail assemblies 22, wherein the fifth transverse width W5 is greater than the fourth transverse width W4. The chassis 24 has a sixth transverse width W6 slightly smaller than the fourth transverse width W4. As such, when the user places the bottom part 25 of the chassis 24 toward the front end of the second rail 32 of the pair of slide rail assemblies 22 in a top-down manner, a front end of the chassis 24 can be guided by the third guiding section 53 of the second rail 32 to be accurately placed on the bottom wall 36 of the second rail 32. Even when the chassis 24 is placed toward the second rail 32 in a top-down manner along a wrong direction, the direction of the chassis 24 can be corrected by the third guiding section 53 at the front end of the second rail 32, such that the chassis 24 can be conveniently and rapidly mounted to the pair of slide rail assemblies 22.

According to the above illustration, the slide rail assembly of the present invention can allow the chassis to be rapidly mounted to the rack, and the chassis can be reliably and stably supported through the guiding design of the slide rail assembly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, configured to mount a chassis to a rack, a plurality of mounting members being arranged at one side of the chassis, the slide rail assembly being mounted to the rack through a pair of brackets, the slide rail assembly comprising:
   a first rail;
   a second rail movable relative to the first rail along a longitudinal direction, the second rail comprising a side wall and a bottom wall perpendicularly connected to the side wall; and
   a guiding base arranged at a front end of the second rail, the guiding base comprising a first guiding section and a second guiding section, the first guiding section and the second guiding section defining an entry, an exit and a passage located between the entry and the exit;
   wherein during mounting the chassis to the rack, the second rail is moved out of the rack relative to the first rail, in order to allow the bottom wall of the second rail to abut against a bottom part of the chassis for further pushing the chassis into the rack, the chassis is mounted to the second rail through guiding the plurality of mounting members by the entry of the guiding base to pass through the passage and the exit of the guiding base.

2. The slide rail assembly of claim 1, wherein a plurality of elongated holes are formed on the side wall of the second rail, the second rail is connected to the first rail by a plurality of connecting members with each of the connecting members passing through one of the plurality of elongated holes, such that the second rail is movable relative to the first rail.

3. The slide rail assembly of claim 1, wherein a front end of the first rail has a protrusion facing the side wall of the second rail, such that when the second rail is moved out of the rack relative to the first rail, the second rail is deflected by the protrusion of the first rail.

4. The slide rail assembly of claim 1, further comprising a blocking member movably mounted on the second rail, a portion of the blocking member being located in the passage of the guiding base.

5. The slide rail assembly of claim 4, wherein the blocking member is configured to be operatively moved away from the passage of the guiding base, in order to allow the chassis to be detached from the second rail.

6. The slide rail assembly of claim 4, wherein the blocking member has an abutting feature, and the blocking member is configured to be operatively moved away from the passage of the guiding base for being held at an abutting position outside the passage of the guiding base by the abutting feature.

7. The slide rail assembly of claim 6, wherein the first rail has a releasing feature corresponding to the blocking member at the abutting position, and one of the releasing feature and the blocking member has an inclined surface configured to push the blocking member away from the abutting position when the second rail is retracted relative to the first rail.

8. The slide rail assembly of claim 1, further comprising an engagement member arranged on the second rail, wherein one of the pair of brackets has a mounting base, the engagement member is engaged with the mounting base when the second rail is retracted relative to the first rail.

9. The slide rail assembly of claim 8, further comprising an elastic member configured to provide an elastic force to the second rail, wherein when the engagement member is disengaged from the mounting base, the second rail is driven to move relative to the first rail by the elastic force of the elastic member.

10. The slide rail assembly of claim 1, wherein one of the first guiding section and the second guiding section of the guiding base has an inclined guiding surface located at the entry, such that a width of the entry is greater than a width of the passage.

11. The slide rail assembly of claim 1, wherein a first transverse width is defined between the side wall and an edge of the bottom wall of the second rail, a second transverse width is defined between the entry of the guiding base and the edge of the bottom wall of the second rail, a third transverse width is defined between the mounting member of the chassis and the edge of the bottom wall of the second rail, the third transverse width is between the first transverse width and the second transverse width.

12. The slide rail assembly of claim 1, wherein the guiding base further comprises a third guiding section located above the first guiding section and configured to guide the chassis above the third guide section to be dropped on the front end of the second rail.

13. The slide rail assembly of claim 12, wherein the third guiding section is extended from an upper portion of the first guiding section and bent outwardly.

* * * * *

UNITED STATES PATENT AND TRADEMARK OFFICE
CERTIFICATE OF CORRECTION

PATENT NO. : 10,028,406 B2
APPLICATION NO. : 15/249499
DATED : July 17, 2018
INVENTOR(S) : Ken-Ching Chen et al.

It is certified that error appears in the above-identified patent and that said Letters Patent is hereby corrected as shown below:

On the Title Page

Under item (65), insert item (30):
--(30) Foreign Application Priority Data
Jan. 22, 2016 (TW).........105102162--

Signed and Sealed this
Eighteenth Day of September, 2018

Andrei Iancu
*Director of the United States Patent and Trademark Office*